United States Patent
Huber et al.

(10) Patent No.: US 11,175,361 B2
(45) Date of Patent: Nov. 16, 2021

(54) METHOD FOR PERFORMING AN NMR MEASUREMENT, PROBE ARRANGEMENT FOR AN NMR SPECTROMETER, AND NMR SPECTROMETER ARRANGEMENT

(71) Applicant: numares AG, Regensburg (DE)

(72) Inventors: Fritz Huber, Regensburg (DE); Volker Pfahlert, Kandern (DE); Martin Reinhard Arnold, Regensburg (DE)

(73) Assignee: numares AG, Regensburg (DE)

( * ) Notice: Subject to any disclaimer, the term of this patent is extended or adjusted under 35 U.S.C. 154(b) by 51 days.

(21) Appl. No.: 16/082,414

(22) PCT Filed: Mar. 6, 2017

(86) PCT No.: PCT/EP2017/055191
§ 371 (c)(1),
(2) Date: Sep. 5, 2018

(87) PCT Pub. No.: WO2017/153337
PCT Pub. Date: Sep. 14, 2017

(65) Prior Publication Data
US 2019/0107592 A1     Apr. 11, 2019

(30) Foreign Application Priority Data
Mar. 9, 2016 (DE) .................... 10 2016 203 891.5

(51) Int. Cl.
*G01R 33/46* (2006.01)
*G01R 33/30* (2006.01)
*G01R 33/36* (2006.01)

(52) U.S. Cl.
CPC ........... *G01R 33/46* (2013.01); *G01R 33/307* (2013.01); *G01R 33/3628* (2013.01)

(58) Field of Classification Search
CPC ... G01R 33/46; G01R 33/307; G01R 33/3628
(Continued)

(56) References Cited

U.S. PATENT DOCUMENTS 5,146,166 A * 9/1992 Bartuska .............. G01R 33/307
324/321
5,397,989 A  3/1995 Spraul et al.
(Continued)

FOREIGN PATENT DOCUMENTS

DE   102008054152 B3   6/2010
WO       2004005952 A1   1/2004
(Continued)

OTHER PUBLICATIONS

AMS Glossary—with wayback date. http://glossary.ametsoc.org/wiki/Refractive_Index. Aug. 2013. (Year: 2013).*

*Primary Examiner* — Dixomara Vargas
*Assistant Examiner* — Sean Curtis
(74) *Attorney, Agent, or Firm* — The Webb Law Firm

(57) ABSTRACT

A method for performing an NMR measurement on a sample contained in a sample tube by using an NMR spectrometer includes: a) feeding a first measuring sample tube in a guiding direction to a pre-measuring area being located, in the guiding direction, before a measuring area of the NMR spectrometer, the pre-measuring area being arranged and designed for measuring a sample parameter of a sample contained in the first measuring sample tube to determine or to estimate an NMR parameter; b) feeding the first measuring sample tube in the guiding direction towards the measuring area; c) setting the NMR parameter previously determined or estimated; and d) carrying out an NMR measurement of the sample contained in the first measuring sample tube on the basis of the set NMR parameter.

7 Claims, 6 Drawing Sheets

(58) Field of Classification Search
USPC .................................................. 324/300–322
See application file for complete search history.

(56) References Cited

U.S. PATENT DOCUMENTS

| | | | | |
|---|---|---|---|---|
| 6,768,305 | B1* | 7/2004 | Keifer | G01R 33/31 324/315 |
| 6,992,759 | B2* | 1/2006 | Nakayama | G01N 21/0303 250/339.07 |
| 7,075,303 | B2* | 7/2006 | Cavaluzzi | G01R 33/30 324/321 |
| 7,081,753 | B2* | 7/2006 | Mullen | G01R 33/3635 324/318 |
| 7,102,354 | B2* | 9/2006 | Ardenkjaer-Larsen | G01R 33/282 219/385 |
| 7,112,963 | B2* | 9/2006 | Hasegawa | G01R 33/31 324/307 |
| 7,145,340 | B2* | 12/2006 | Rindlisbacher | G01R 33/307 324/321 |
| 7,245,126 | B1* | 7/2007 | Hasegawa | G01R 33/31 324/315 |
| 7,248,050 | B2* | 7/2007 | Hofmann | G01R 33/307 324/315 |
| 7,372,274 | B2* | 5/2008 | Ardenkjaer-Larsen | G01R 33/282 324/321 |
| 7,570,053 | B2* | 8/2009 | Hasegawa | G01R 33/31 324/307 |
| 7,642,783 | B2* | 1/2010 | Freytag | G01R 33/3642 324/322 |
| 7,750,636 | B2* | 7/2010 | Shiino | G01R 33/307 324/321 |
| 7,872,476 | B2* | 1/2011 | Ikeda | G01R 33/3635 324/322 |
| 8,013,602 | B2* | 9/2011 | Otvos | G01R 33/465 324/309 |
| 8,154,292 | B2* | 4/2012 | Bovier | G01R 33/30 324/318 |
| 8,217,655 | B2* | 7/2012 | De Vries | G01R 33/307 324/321 |
| 8,624,599 | B2* | 1/2014 | Kamlowski | G01R 33/307 324/321 |
| 8,704,521 | B2* | 4/2014 | Otvos | G01R 33/307 324/318 |
| 8,779,768 | B2* | 7/2014 | Brey | G01R 33/34023 324/307 |
| 8,885,174 | B2* | 11/2014 | Jourdain | G01N 21/45 356/518 |
| 9,274,199 | B2* | 3/2016 | Brey | G01R 33/34023 |
| 9,482,729 | B2* | 11/2016 | Gisler | G01R 33/31 |
| 9,903,925 | B2* | 2/2018 | Kim | G01R 33/62 |
| 10,048,335 | B2* | 8/2018 | Matsunaga | G01R 33/307 |
| 10,365,339 | B2* | 7/2019 | Otvos | G01R 33/307 |
| 10,371,774 | B2* | 8/2019 | Cousin | G01R 33/387 |
| 10,416,077 | B2* | 9/2019 | Nagai | G01N 21/4133 |
| 10,775,456 | B2* | 9/2020 | Toshima | G01R 1/06772 |
| 2004/0049108 | A1* | 3/2004 | Ardenkjaer-Larsen | G01R 33/282 600/412 |
| 2004/0066193 | A1* | 4/2004 | Ardenkjaer-Larsen | G01R 33/282 324/309 |
| 2004/0108852 | A1* | 6/2004 | de Swiet | G01R 33/34069 324/321 |
| 2004/0233423 | A1* | 11/2004 | Nakayama | G01N 21/0303 356/246 |
| 2004/0251903 | A1* | 12/2004 | Hasegawa | G01R 33/34069 324/321 |
| 2005/0024055 | A1* | 2/2005 | Cavaluzzi | G01R 33/30 324/321 |
| 2005/0225328 | A1* | 10/2005 | Ardenkjaer-Larsen | G01R 33/282 324/321 |
| 2005/0242808 | A1 | 11/2005 | McKendry et al. | |
| 2005/0242809 | A1* | 11/2005 | McKendry | G01R 33/307 324/308 |
| 2005/0242811 | A1* | 11/2005 | Schaepman | G01N 24/085 324/315 |
| 2005/0247493 | A1* | 11/2005 | Aptaker | G01G 9/00 177/1 |
| 2006/0012368 | A1* | 1/2006 | Volke | G01R 33/307 324/318 |
| 2006/0091885 | A1* | 5/2006 | Rindlisbacher | G01R 33/307 324/321 |
| 2006/0192559 | A1* | 8/2006 | Ardenkjaer-Larsen | G01R 33/307 324/321 |
| 2007/0194789 | A1* | 8/2007 | Hasegawa | G01R 33/3403 324/313 |
| 2008/0150527 | A1* | 6/2008 | Hasegawa | G01R 33/31 324/307 |
| 2008/0204015 | A1* | 8/2008 | Shiino | G01R 33/389 324/307 |
| 2009/0102482 | A1* | 4/2009 | Freytag | G01R 33/30 324/318 |
| 2009/0261829 | A1* | 10/2009 | Ikeda | G01R 33/34092 324/318 |
| 2010/0109666 | A1 | 5/2010 | Armbruster et al. | |
| 2010/0171495 | A1* | 7/2010 | Bovier | G01R 33/3873 324/309 |
| 2011/0204894 | A1* | 8/2011 | Kamlowski | G01R 33/307 324/321 |
| 2011/0295517 | A1* | 12/2011 | Otvos | G01R 33/307 702/19 |
| 2012/0038931 | A1* | 2/2012 | Jourdain | G01N 21/45 356/518 |
| 2014/0084928 | A1* | 3/2014 | Gisler | G01R 33/31 324/321 |
| 2014/0184223 | A1* | 7/2014 | Otvos | G01R 33/307 324/318 |
| 2014/0320131 | A1* | 10/2014 | Brey | G01R 33/62 324/322 |
| 2015/0160311 | A1* | 6/2015 | Rapoport | B65G 51/22 324/321 |
| 2015/0300968 | A1* | 10/2015 | Bae | G16B 15/10 506/6 |
| 2016/0003753 | A1* | 1/2016 | Augustine | G01N 24/084 324/309 |
| 2016/0231397 | A1* | 8/2016 | Mizuno | G01R 33/3403 |
| 2017/0030985 | A1* | 2/2017 | Gerald, II | G01R 33/307 |
| 2017/0325710 | A1* | 11/2017 | Ryan | G01R 33/288 |
| 2017/0336485 | A1* | 11/2017 | Hobo | G01R 33/34023 |
| 2019/0041327 | A1* | 2/2019 | Nagai | G01N 21/4133 |
| 2019/0107592 | A1* | 4/2019 | Huber | G01R 33/3628 |
| 2019/0317165 | A1* | 10/2019 | Otvos | G01R 33/465 |
| 2019/0331747 | A1* | 10/2019 | Toshima | G01R 33/34023 |
| 2020/0264250 | A1* | 8/2020 | Osen | G01R 33/31 |
| 2020/0309879 | A1* | 10/2020 | Meister | G01N 24/08 |

FOREIGN PATENT DOCUMENTS

| WO | WO-2004005952 A1 * | 1/2004 | ........... G01R 33/307 |
|---|---|---|---|
| WO | WO-2014207809 A1 * | 12/2014 | ......... G01N 21/4133 |

* cited by examiner

METHOD FOR PERFORMING AN NMR MEASUREMENT, PROBE ARRANGEMENT FOR AN NMR SPECTROMETER, AND NMR SPECTROMETER ARRANGEMENT

CROSS-REFERENCE TO RELATED APPLICATIONS

This application is the United States national phase of International Application No. PCT/EP2017/055191 filed Mar. 6, 2017, and claims priority to German Patent Application No. 10 2016 203 891.5 filed Mar. 9, 2016, the disclosures of which are hereby incorporated in their entirety by reference.

BACKGROUND OF THE INVENTION

Field of the Invention

The instant invention relates to a method for performing an NMR measurement, to a probe arrangement for an NMR spectrometer, and to an NMR spectrometer optionally comprising such a probe arrangement.

Description of Related Art

According to the state of the art, NMR sample tubes are individually introduced into the probe of an NMR spectrometer from the top of the probe. This task is accomplished by a probe robot and a sample tube lift operated by compressed air. Each NMR sample tube contains a sample to be measured in the NMR spectrometer. A desired measuring temperature of this sample is adjusted in the measuring area of the probe of the NMR spectrometer. In addition, NMR parameters like tune parameters, match parameters and shimming parameters are adjusted in the measuring area after the sample tube has been introduced into the probe. The measurement itself usually takes place with a rather imprecise positioning of the sample tube within the probe. Sample tube discharge from the probe takes usually place along the same path as feeding the sample tube to the probe, but in opposite direction. In such arrangements, only a single sample tube is present in the NMR spectrometer at a time.

The ratio of measurement time to sample preparation and sample feeding and discharge time in the NMR spectrometer is approximately 1 to 5 in such prior art devices. This unfavourable time ratio is one of the main reasons that it is currently not possible to use NMR spectrometers for high throughput analyses of samples.

There exist further technical solutions which allow for a faster sample tube transportation through the probe of NMR spectrometer. However, these technical solutions have not been introduced into the market, presumably due to technical difficulties upon implementation of these solutions.

U.S. Pat. No. 5,146,166 A describes an automatic liquid sample changer in which individual sample tubes are introduced from a first side into the probe of an NMR spectrometer and which are discharged in the same direction at an opposite side of the probe of the NMR spectrometer.

This solution, however, allows only a single sample tube to be present in the probe. Thus, temperature equilibration of the sample tube has to be accomplished within the probe. This takes considerable time. In addition, the sample tube positioning within the probe is quite imprecise since the sample tube is positioned on an air cushion.

WO 2004/005952 A1 describes a similar NMR probe arrangement, wherein it does not disclose structural details as to how individual sample tubes are to be transported within the probe. This international patent application discloses rather generally to use air for sample tube transportation.

U.S. 6,768,305 B1 discloses a probe for an NMR spectrometer in which a queue of sample tubes can be transported. The discharge mechanism is arranged below the probe to discharge the lowest sample tube out of a stack of sample tubes. This arrangement requires an additional mechanism (namely the discharge device) below the probe. It additionally requires a stack of sample tubes above and below a high-frequency coil in the probe and makes the positioning of individual sample tubes within the measuring area quite difficult.

SUMMARY OF THE INVENTION

It is an object of the instant invention to provide a probe arrangement for an NMR spectrometer that allows for a high throughput sample analysis by NMR spectroscopy but overcomes the before-mentioned disadvantages of prior art.

This object is achieved by a method for performing an NMR measurement on a sample contained in a sample tube by using an NMR spectrometer having features as described herein.

This method comprises the step of feeding a first measuring sample tube in a guiding direction to a pre-measuring area. The pre-measuring area is located in front of a measuring area of the NMR spectrometer in the guiding direction. The pre-measuring area serves for measuring a sample parameter of a sample contained in the first measuring sample tube to determine or to estimate an NMR parameter.

The terms "before" and "in front of" with respect to the guiding direction are to be understood with respect to a movement of a sample tube being transported in the guiding direction. The sample tube reaches first a first device/area that is located in front of a second device/area so that the first device is located before or in front of the second device/area in the guiding direction. In the same way, the terms "behind" or "after" are to be construed.

The method further comprises the step of transporting the first measuring sample tube in the guiding direction towards the measuring area.

The method further comprises the step of setting the NMR parameter previously determined or estimated in the NMR spectrometer.

The method further comprises the step of carrying out an NMR measurement of the sample contained in the first measuring sample tube on the basis of the set NMR parameter. I.e., the variable settings of the NMR spectrometer are adjusted by the NMR parameter previously determined or estimated.

The previously described steps can be carried out in the sequence indicated above or in any other logically suited sequence. To give an example, it is possible to first set the NMR parameter and to then feed the first measuring sample tube in the guiding direction towards the measuring area. However, it is necessary to first determine or estimate the NMR parameter before it can be set into the NMR spectrometer.

Such a pre-measuring area enables the determination or estimation of NMR parameters that can, in conventional NMR spectrometer arrangements, only be determined or estimated after the sample tube has been brought into its final measuring position within the probe of the NMR spectrometer. Such determination or estimation is often a time-consuming method step. If it is accomplished only after the sample tube has been positioned in its final measuring position, the overall measuring time increases. If this method step is carried out while the sample tube is fed to the high frequency coil of the probe, significant savings in time result.

In an embodiment, the pre-measuring area is the measuring zone of a pre-measuring device. Such a pre-measuring device serves for measuring at least one sample parameter of the sample contained in a sample tube being positioned before the high frequency coil. A suited pre-measuring device is a camera, a sensor barrier, a pyrosensor (also referred to as passive infrared sensor) or a transmitter and receiver of high frequency fields. Combinations of these pre-measuring devices are possible.

A camera is well suited for measuring the turbidity, the optical density and the inhomogeneity of a sample. In addition, a camera can be used to measure the filling height of the NMR sample tube.

A light barrier is well suited to detect the height, the filling height or the length of the NMR sample tube and/or the transparency, any gas bubbles (such as air bubbles) or any contaminations of the sample contained in the NMR sample tube and/or a correctly positioned NMR sample tube cap or cracks or scratches in the material of the NMR sample tube. A light barrier is well suited for those purposes since the NMR sample tubes are, in an embodiment, slowly moved past the light barrier with a defined movement speed.

A pyrosensor can be used to measure the sample temperature.

In a further embodiment, the method makes use of determination or estimation modules that are capable of determining or estimating an NMR parameter based on the measured sample parameter(s).

In an embodiment, the NMR measurement is carried out immediately after the first measuring sample tube has reached its intended measuring position in the measuring area. Then, no time is wasted for NMR parameter adjustments. Such adjustments are already accomplished when the measuring sample tube reaches its intended measuring position.

In a further embodiment, the sample parameter is chosen from the group comprising permeability of the sample, susceptibility of the sample, temperature of the sample, optical density of the sample, turbidity of the sample, inhomogeneity of the sample, filling level of the sample tube and high frequency shielding properties of the sample. It is possible to measure more than one of the before-mentioned sample parameters for the same sample.

To give an example, the susceptibility of the sample is a pivotal parameter with respect to shim adjustments of the NMR spectrometer. If the susceptibility of the sample is measured prior to introducing the sample into the probe, necessary shim adjustments (expressed by shimming parameters) can already be preset in the NMR spectrometer when the sample enters the probe, thus making time-consuming shim adjustments after introducing the sample tube into the probe unnecessary.

To give a further example, the high frequency shielding properties of the sample are a precise measure for determining the salt content of the sample.

In a further embodiment, the estimated or determined NMR parameter is one or more tune parameters, one or more match parameters and/or one or more shimming parameters. The technical effects of these parameters and the advantages connected to determine or estimating those parameters already before the NMR sample tube has reached the final measuring position will be explained in the following.

To measure an NMR spectrum, the according sample has to be in a homogeneous magnet field. Since the sample itself distorts the magnet field, the static magnet field of the NMR device has to be superimposed by small adjustable magnetic correction fields. This procedure of homogenizing the magnet field is generally referred to as shimming.

If the shim parameter is already determined or estimated while the respective sample tube is in the pre-measuring area, the necessary shim parameters can be preset upon entering of the sample tube into the probe or the measuring area, respectively. This significantly reduces the time demand for a single measurement.

Tune and match parameters are used to adjust the resonant circuits in the NMR probe such that they are tuned to resonance. This is a prerequisite for measuring NMR spectra. Similar to the shimming parameters, it is also possible to preset the tune and match parameters when the sample tube with the sample to be measured enters the probe or the measuring area, respectively, after the tune and match parameters have been previously determined or estimated while the sample tube was positioned in the pre-measuring area.

It should be noted that tuning of an NMR spectrometer is carried out according to prior art just prior to starting the measurement when the sample tube with the sample to be measured is already positioned in the final measuring area of the probe. Tuning regularly takes 20 to 30 seconds. Due to time reasons, tuning is not carried out for each sample. In an embodiment of the instantly claimed method, tuning can be carried out for each sample without any additional time requirement, since the necessary measurements are done when the sample "waits" to be measured by NMR, namely while it is present in the pre-measuring area.

It is not necessary to apply a magnet field to a sample in order to determine the tuning parameters necessary for a correct tuning of the NMR spectrometer. Rather, measuring of the dielectric properties of the sample is sufficient for determining the tuning parameters. Therefore, the tuning parameters can already be determined prior to introducing the sample tube containing the sample into the probe. Therewith, a significant time saving results leading to the possibility to perform a tuning operation for each sample. Consequently, the measuring quality increases, wherein the time necessary for performing the measurement decreases.

In an embodiment, it is possible to determine the necessary tune parameters for some samples within the probe. These tune parameters can then be compared with the tune parameters determined by an external unit associated to or being part of the probe. In doing so, a calibration and a functional control of such an external unit can be easily carried out.

According to NMR devices known from prior art, NMR sample tubes are centered by a so-called spinner in the probe. However, the spinner guidance is rather imprecise and is only able to position one end of the sample tube. In addition, the positioning is not reproducible so that even for an identical sample tube a novel shimming has often to take place after this sample tube has been removed and reintroduced into the probe.

In an embodiment, the first measuring sample tube has a first end and a second end. It is fixed on its first end and its second end in the measuring area during an NMR measurement of the sample contained in the first sample tube. This decreases the positioning variability and increases the positioning reproducibility of the first measuring sample tube in the measuring area. According to this embodiment, a precise fixation on both ends of the sample tubes is enabled (e.g., if a plurality of sample tubes guide and fix each other or if guiding rods are used). Therewith, significantly more precise guidance of the sample tubes into the probe and within the probe is possible. Consequently, the variation width of the shim to be applied after a sample tube replacement is significantly reduced. The shim parameters are essentially only dependent on the susceptibility of the sample contained in the sample tube and not on position variations of the sample tube (since these position variations are reduced to a minimum).

This factor additionally results in an increased quality of the line form of the resulting NMR spectra without a new adjustment of the shim. Since the variation of the shim parameter is reduced, the time necessary for a new shim is also reduced. Therewith, the total time for measuring a plurality of samples is also reduced.

Due to the imprecise positioning of the sample tube in prior art NMR devices as outlined above, new adjustments of the resonant circuits by tune and match parameters have often to be performed even for the same sample tube if it has been removed and reintroduced into the probe.

Like in case of shim parameters, also the variation of the tune and match parameters is significantly reduced by a precise guidance being possible by fixing the measuring sample tube on both ends. Due to this more precise guidance, the tune and match parameters are essentially only dependent on the permeability and the susceptibility of the sample. Even without a new tune and match, the NMR measurement can be done more precisely than in prior art. Since the variation width of the tune and match adjustments is reduced, the time demand and the mechanic abrasion of trim capacitors and step motors is reduced.

In a further embodiment, the method makes use of a control device being arranged and designed to preset the previously determined or estimated NMR parameter in an NMR spectrometer. Such a setting operation could also be carried out with the aid of the general NMR spectrometer control. Setting the relevant NMR parameters when the respective sample tube containing the sample to be measured is introduced into the probe rather than starting with determining the relevant NMR parameters saves much time for the overall measuring process. Shifting time-consuming parameter determination or estimation processes from the time period in which the NMR sample tube is present in the measuring area next to the high-frequency coil (and which determines the overall measuring time) to the time interval in which the NMR sample tube is present in the probe or a preceding unit before the high frequency coil (which is not important for the overall measuring time if a plurality of NMR sample tubes is measured) significantly decreases the time being necessary for the NMR measurement itself. Expressed in other words, the NMR sample tube with the sample to be measured can be arranged with respect to the high frequency coil to carry out an NMR measurement when the NMR spectrometer is already specifically adjusted to the individual sample to be measured. In prior art, such an individual adjustment was only possible after the NMR sample tube has been positioned in the measuring position. This resulted in a significant time delay for the overall measurement process.

Presetting of NMR parameters like tune parameters, match parameters and/or shimming parameters thus speeds up the whole NMR measuring process.

In an aspect, the invention also relates to a probe arrangement having the features explained in the following. Such a probe arrangement for an NMR spectrometer comprises a bore in which a pathway for sample tubes to be guided through the probe arrangement in a guiding direction is defined. The probe arrangement further comprises a high-frequency coil for generating high-frequency magnetic pulses in order to carry out NMR measurements. Thereby, this high frequency coil defines a measuring area for performing an NMR measurement of a sample contained in a sample tube.

According to the presently claimed invention, the probe arrangement comprises a sample tube transport mechanism located within the bore that serves for guiding the sample tubes exclusively in the guiding direction through the bore and that further serves for blocking a movement of the sample tubes such that a sample tube containing a sample to be measured (i.e. the measuring sample tube) is kept in the measuring area during a defined time period, thus allowing an NMR measurement of the sample. The first measuring sample tube is a sample tube which has not been yet subjected to an NMR measurement, but which is to be subjected to an NMR measurement.

The probe arrangement according to the invention enables NMR sample tubes to run through the probe, e.g. from top to bottom or from bottom to top. Therewith, it is possible that more than one sample tube is present at the same time in an NMR spectrometer equipped with a probe arrangement according to the claimed invention. The sample tube transport mechanism serves for precise positioning of the individual sample tubes within the measuring area and for a guidance of the sample tubes through the bore.

Since the sample tube transport mechanism is located within the bore, the probe arrangement demands less space than in case of any mechanisms for transporting sample tubes that are located above or beneath the probe. Furthermore, it is not necessary for such a sample tube transport mechanism that a stack of sample tubes is established below the high-frequency coil.

It is possible to equip a standard NMR spectrometer with a probe arrangement according to the claimed invention. Thus, the probe arrangement is suited for all conventional NMR spectrometers that can be easily provided with the probe arrangement according to the claimed invention by replacing the used probe or probe arrangement by a probe arrangement according to the claimed invention.

In an embodiment, the probe arrangement comprises a pre-measuring device defining a pre-measuring area in front of the measuring area in the guiding direction. The pre-measuring device serves for measuring a sample parameter of a sample contained in a sample tube being positioned before the high frequency coil to determine or estimate an NMR parameter. Reference is made to the explanations above regarding the effects of such a pre-measuring device and pre-measuring area.

In an embodiment, the probe arrangement comprises a first blocker for blocking the movement of a first sample tube along the guiding direction. Thereby, the first blocker can be transferred from a non-blocking position to a blocking position and vice versa. In this embodiment, the probe arrangement further comprises a second blocker for blocking a movement of a second sample tube along the guiding direction. Thereby, also the second blocker—like the first blocker—can be transferred from a non-blocking position to a blocking position and vice versa.

Finally, the first blocker and the second blocker are operatively coupled to each other in such a way that at least one of the first blocker and the second blocker needs to be present in its blocking position. Expressed in other words, the first blocker cannot be in its non-blocking position if the second blocker is in its non-blocking position.

Thus, in this embodiment two operatively coupled blockers are used that can allow or prohibit the movement of sample tubes being present within the probe arrangement. Thereby, a defined distance of movement of individual sample tubes within the probe arrangement can be made possible so that each sample tube containing a sample to be measured can be transported to a measuring position within the probe arrangement. The defined movement of the sample tubes serves for discharging individual sample tubes without breaking these sample tubes. NMR sample tubes can quite easily break since they are usually made of glass.

Generally, NMR probes are vertically aligned so as to allow vertical movement of the sample tubes to be moved into and out of the probe. In an embodiment, the instantly claimed probe arrangement is also arranged to be vertically aligned so that the guiding direction is a vertical direction from top to bottom of the probe arrangement. In doing so, it is possible to make use of gravity for transporting the sample tubes through the probe arrangement.

In an embodiment, the first blocker and/or second blocker are mechanical blocking devices that mechanically interact with the sample tubes, the movement of which is to be blocked.

In an embodiment, the first blocker and the second blocker are inversely opened or closed, respectively. Thus, in this embodiment the first blocker and the second blocker are operatively coupled to each other such that the first blocker is in its non-blocking position if the second blocker is in its blocking position. Additionally, the first blocker is in its blocking position if the second blocker is in its non-blocking position. In doing so, it is guaranteed that a sample tube cannot move across the first blocker and the second blocker at the same time, but is at least stopped by one of the first blocker and the second blocker.

In an embodiment, the first blocker and/or the second blocker are located within the bore of the probe arrangement, namely, behind the high-frequency coil in the guiding direction. If the probe arrangement is vertically positioned, the guiding direction extends vertically from top to bottom of the probe arrangement. Then, the first blocker and the second blocker are located below the high-frequency coil. By arranging the blockers within the bore of the probe, it is not necessary to provide an additional discharge mechanism below the probe as described in prior art. Therefore, the space required by the instantly claimed probe arrangement can be made considerably smaller than the space requirement of probe arrangements with a separate discharge unit arranged below the probe.

Using blockers arranged within the bore of the probe arrangement instead of using a separate discharge device below the probe has additional advantages. In doing so, it is not necessary to provide a full stack of sample tubes behind the high-frequency coil in the guiding direction (e.g., below the high-frequency coil). Rather, it is fully sufficient if two sample tubes are positioned behind the high-frequency coil in the guiding direction. Then, the last sample tube in the guiding direction (e.g., the lowest sample tube), is blocked/supported by the second blocker. The second to last (e.g. the second lowest) sample tube is blocked/supported by the first blocker. The second to last sample tube itself supports at least one measuring sample tube in which the sample measured is placed. It can also support a full stack of sample tubes being positioned before the second to last sample tube in the guiding direction (e.g., above the second to last sample tube).

Thereby, the second to last sample tube does not only support the measuring sample tube, but also serves for a correct alignment of this measuring sample tube within the measuring region of the probe arrangement. This measuring region is the zone of the probe arrangement in which the high-frequency coil is positioned. Then, the high-frequency magnetic pulses generated by the high-frequency coil can interact with a sample contained in the measuring sample tube.

The sample tubes being present in the pathway of the probe arrangement can guide each other. Thus, each sample tube can guide its adjacent sample tube by directly contacting its adjacent sample tube by its top (i.e., a cap) or its bottom, respectively. The top and the bottom of a sample tube can also be denoted as first and second end of the sample tube.

In an embodiment, the sample tube transport mechanism once again comprises a first blocker for blocking a movement of a first sample tube along the guiding direction. Thereby, the first blocker can be transferred from a non-blocking position to a blocking position and vice versa.

In this embodiment, the sample tube transport mechanism further comprises at least two third blockers for blocking a movement of a first measuring sample tube along the guiding direction. Thereby, also each of the third blockers—like the first blocker—can be transferred from a non-blocking position to a blocking position and vice versa. Finally, the first blocker is arranged behind the high-frequency coil in the guiding direction and the third blockers are arranged in front of the high-frequency coil in the guiding direction.

The first blocker and the third blockers enable a defined distance of movement of individual sample tubes within the probe arrangement so that each sample tube containing a sample to be measured can be transported to a measuring position within the probe arrangement.

In this embodiment, using blockers arranged within the bore of the probe arrangement instead of using a separate discharge device below the probe has additional advantages. In doing so, it is not necessary to provide a full stack of sample tubes behind the high-frequency coil in the guiding direction (e.g., below the high-frequency coil). Rather, it is fully sufficient if one sample tube is positioned behind the high-frequency coil in the guiding direction. Then, this last sample tube in the guiding direction (e.g., the lowest sample tube), is blocked/supported by the first blocker. Thereby, it supports one measuring sample tube in which a sample to be measured is placed. Furthermore, the last sample tube does not only support the measuring sample tube, but also serves for a correct alignment of this measuring sample tube within the measuring region of the probe arrangement.

As indicated above, NMR probes are generally vertically aligned. In such a vertical arrangement, the first blocker can also be referred to as lower blocker or adjusting blocker, and the third blockers can also be referred to as upper blockers.

In an embodiment, the third blockers are grouped into a first group and into a second group. Thereby, every second of the third blockers (e.g., the first, the third, the fifth etc. of the third blockers) belongs to the first group and the remaining third blockers (the respective other second of the third blockers, e.g., the second, the forth, the sixth etc. of the third blockers) belong to the second group. Thereby, the third blockers are operatively coupled to each other such that all third blockers of the first group are in their blocking position or in their non-blocking position at the same time. Equally, the third blockers of the second group are in their blocking position or in their non-blocking position at the same time. Thereby, the third blockers of the first group and the third blockers of the second group cannot be in the non-blocking position at the same time. Thus, at least one group of third blockers is present in its blocking position at a specific time point.

This operative coupling guarantees that a sample tube inserted into the pathway for sample tubes cannot pass along all third blockers in a single movement, but is at least stopped by the second of the third blockers it reaches (namely, if the first of the third blockers it passes is in its non-blocking or open position).

In an embodiment, the third blockers of the first group and the third blockers of the second group are inversely opened or closed, respectively. Thus, in this embodiment the third blockers of the first group and the third blockers of the second group are operatively coupled to each other such that the third blockers of the first group are in their non-blocking position if the third blockers of the second group are in their blocking position. Additionally, the third blockers of the first group are in their blocking position if the third blockers of the second group are in their non-blocking position. In doing so, it is guaranteed that a sample tube cannot move across the third blockers of the first group and the third blockers of the second group at the same time, but is at least stopped by one of the third blockers of the first group or by one of the third blockers of the second group.

In an embodiment, all third blockers are designed equally, but different from the first blocker. They may have at least one supporting member for supporting a lower side of the sample tube to be blocked when the respective third blocker is in its blocking position. The supporting member can be, e.g., a bar, rod, plate or any other structure that is suited to support an NMR sample tube on its bottom or a lower lateral side and to avoid the movement of the NMR sample tube.

In an embodiment, the third blockers are designed in the same way like the first blocker. In addition, once again all third blockers may be designed equally. If the third blockers are designed in the same way like the first blocker, only one type of blocking mechanism is necessary to be produced in order to make up the instantly claimed probe arrangement. This reduces the total number of parts to be produced for manufacturing the probe arrangement and thus facilitates the manufacturing process.

In another embodiment, not all of the third blockers are designed in the same way. Rather, a combination of different third blockers having distinct designs is also possible.

In an embodiment, the first blocker, the second blocker and/or the third blockers are located within the bore. Thereby, the first blocker is located within the bore behind the high-frequency coil in the guiding direction such that—during intended operation of the probe arrangement—the first blocker blocks in its blocking position a first sample tube that has already passed the high-frequency coil. Thereby, the first sample tube is adjacent to a measuring sample tube which in turn is in a measuring position, i.e. in a position with respect to the high-frequency coil such that the sample contained in the measuring sample tube can be subjected to an NMR measurement. The first sample tube can be a sample tube containing a sample which has been subjected to an NMR measurement prior to the sample contained in in the current measuring sample tube.

Alternatively or additionally, the second blocker is, in an embodiment, located within the bore behind the first blocker in the guiding direction such that—during intended operation of the probe arrangement—the second blocker blocks in its blocking position the second sample tube that has already passed the high-frequency coil as well as the first blocker. In addition, the second sample tube is adjacent to the first sample tube which in turn is positioned with respect to the first blocker such that the movement of the first sample tube can be blocked by the first blocker if the first blocker is in its blocking position. The second sample tube can, e.g., be a sample tube containing a sample that has been subjected to an NMR measurement prior to the sample contained in the first sample tube and thus also prior to the sample contained in the current measuring sample tube.

In the precedingly explained embodiments, the measuring sample tube abuts with its bottom against a top of the first sample tube. Thus, the first sample tube supports and adjusts the position of the measuring sample tube during intended operation of the probe arrangement. Therefore, the first blocker can also be denoted as blocker having an adjustment function since it is responsible to fix the first sample tube in a defined position so that the first sample tube in turn aligns the measuring sample tube in the correct measuring position.

In addition, it is possible that the bottom of the first sample tube abuts against the top of the second sample tube so that an arrangement of three sample tubes is formed, wherein each sample tube abuts against its adjacent sample tube(s).

However, it is not necessary that the second sample tube in fact contacts the first sample tube. Rather, it is also possible that a small distance is present between the bottom of the first sample tube and the top of the second sample tube during intended operation of the probe arrangement. This depends on the specific position of the first blocker and the second blocker. Since the second blocker is not intended to adjust or align the second sample tube in a specific position, it can also be denoted as blocker having a brake function (sometimes also referred to as break function).

In an embodiment, the first blocker, the second blocker and/or the third blockers have at least two cams that are designed to abut against lateral regions of the first sample tube if the respective blocker is in its blocking position. Thus, the respective blocker can be arranged like a grip mechanism, gripping with its cams against the sides of the first sample tube. The cams can be, e.g., designed such that they have an oval shape, i.e. a first axis of extension which is longer than a second axis of extension. In such an embodiment, it is possible to mount the cams on a rotating element such as a rod so that contacting portions of the cams can be moved closer to a sample tube passing by or can be moved farer away from the sample tube moving by. Then, the blocking position would be a position in which the cams contact the sample tube and the non-blocking position would be a position in which the cams do not contact the sample tube.

In an embodiment, the at least two cams are arranged opposite each other so that they can contact opposite sides of a sample tube, the movement of which is to be blocked. If three or four cams are used, it is possible to arrange them uniformly distant from each other. Then, the blocking forces are transferred from the respective blocker to the first sample tube to be blocked in a particularly suited manner.

In an embodiment, the second blocker has at least one supporting member for supporting the lower side of the sample tube to be blocked when the second blocker is in its blocking position. The supporting member can be, e.g., a bar, rod, plate or any other structure that is suited to support an NMR sample tube on its bottom or a lower lateral side and to avoid the movement of the NMR sample tube.

It is also possible to design the second blocker in the same way like the first blocker. However, since blocking the movement of the sample tube to be blocked by the supporting member is mechanically easier to realize than blocking a sample tube to be blocked by a precisely working cam arrangement, and since an exact positioning of the second sample tube is not necessary, it is easier to design the second blocker such that it comprises at least one supporting member for supporting a lower side of the sample tube to be blocked.

In this circumstance, it should be noted that the terms "first sample tube" and "second sample tube" are to be interpreted as "sample tube to be blocked". The terms "first" and "second" are used to make an understanding of the claimed invention easier. However, it should be noted that the first sample tube which is first blocked by the first blocker becomes automatically the second sample tube when it moves forward along the guiding direction within the pathway of the probe arrangement. However, at a specific time point during intended operation of the claimed probe arrangement, the first sample tube is indeed different from the second sample tube.

In an embodiment, the probe arrangement comprises a motor for operating the first blocker, the second blocker and/or the third blockers. This motor can be arranged within the bore of the probe arrangement or adjacent to the probe. It should be noted that such a motor does not require much space. It is only necessary to operatively couple the motor with the first blocker and/or the second blocker in order to transfer energy provided by the motor (such as in form of movements) to the first blocker, the second blocker and/or the third blockers. It is possible to use one motor for the first blocker and another motor for the second blocker or for the third blockers.

In another embodiment, the probe is designed and arranged to be provided with a gas stream having a defined temperature. Air or compressed air is a suitable gas for establishing such a gas stream. Using the same gas stream for the measuring area (next to the high frequency coil) and the portions of the probe before the high frequency coil is connected to the technical effect that the samples before the high frequency coil are adjusted to the same temperature that is present at the measuring area. Thus, a time-consuming temperature adjustment in the measuring position is no longer necessary when this embodiment is applied.

In prior art devices, sample tubes and therewith the samples contained in those sample tubes are often pre-warmed in a separate heating unit outside an NMR spectrometer. This separate heating unit requires a separate calibration of the temperature to be present in the heating unit. After leaving the separate heating unit, the sample tubes are transported by a sample tube lift operated by compressed air having an undefined temperature into the measuring area of the probe. In this measuring area the final temperature adjustment takes place by an air stream having an adjustable temperature. This final temperature adjustment requires approximately 30 seconds.

According to the explained embodiment of the probe arrangement, the sample tubes waiting to be transported into the measuring area of the probe are already pre-heated by the same gas stream being responsible for a final temperature adjustment of the sample tubes in the measuring area. In doing so, the sample tubes entering the measuring area are already brought to the final measuring temperature. There occurs no corruption of the adjusted temperature by compressed air having an undefined temperature. In addition, only a single calibration of the temperature adjustment is necessary since separate external heating units are no longer needed. Furthermore, the waiting time for a temperature adjustment of the sample tube in the measuring area of the probe is completely omitted.

In an embodiment, the probe arrangement comprises at least three rods arranged such that they surround and limit a guiding space in their middle as pathway for sample tubes. Thus, these guiding rods are not intended that sample tubes are guided in their interior. Rather, they define a guiding space to be used as pathway for sample tubes. Thus, the pathway is surrounded by air and by the at least three guiding rods. To give an example, it is possible to arrange the three guiding rods at the edges of a virtual triangle so that the sample tube can be guided within the interior of the virtual triangle. The triangle can be an isosceles triangle. In another embodiment, the at least three guiding rods are arranged in a circular manner such that they are equally distant from each other.

In an embodiment, at least one of the guiding rods is hollow so as to be able to transport a fluid. Then, it is possible to let the guiding rods transport a warm or cold fluid (e.g., a gas such as air) so as to bring a sample in a measuring sample tube to the desired measuring temperature. Thereby, the heating or cooling fluid can be introduced into the guiding rod such that it first flows opposite to the guiding direction (e.g. upwards, if the guiding direction is vertically downwards) and then exits the guiding rod. It can then flow within the pathway in the guiding direction. In an embodiment, all guiding rods are hollow so as to transport a fluid to allow for the heating or cooling of a sample to be measured in a particularly suited manner.

Is also possible that the guiding rods comprise different compartments that are fluidly connected to each other in a connection region. Then, it is possible that the fluid flows through a first compartment, exits the first compartment, enters the connection region, exits the connection region into a second compartment, flows through the second compartment and then exits the second compartment. In doing so, it is also possible to establish a fluid flow in different directions (e.g., against the guiding direction in the first compartment and in the guiding direction in the second compartment of the guiding rod).

In an embodiment, at least one of the guiding rods has at least two compartments in its interior that are fluidly tight separated from each other. In this embodiment, it is possible to establish different flows of fluid within one and the same guiding rod. If this embodiment is combined with the precedingly explained embodiment, it is also possible to establish 2 separate fluid flows within one guiding rod, wherein both fluid flows have fluid flow portions in different directions (such as in the guiding direction and against the guiding direction). Then, it is possible to use a continuing guiding rod extending from the top of the probe arrangement to the bottom of the probe arrangement, but allow for different fluid flows within the guiding rod.

If the flow of the fluid having a defined temperature is established in at least one guiding rod being arranged in front of the high-frequency coil in the guiding direction, it is possible to pre-warm or pre-cool samples contained in the sample tube prior to measuring them. This reduces the time necessary for a temperature equilibration in the measuring position and thus speeds up the whole measuring process.

The instantly claimed invention also relates in an aspect to an NMR spectrometer arrangement comprising an NMR spectrometer. Thereby, the NMR spectrometer arrangement further comprises a pre-measuring device defining a pre-measuring area, wherein the pre-measuring device serves for measuring a sample parameter of a sample contained in a sample tube to determine or estimate an NMR parameter. Thereby, the pre-measuring area is located, in a guiding direction in which sample tubes are guided through the NMR spectrometer arrangement, in front of a measuring area of the NMR spectrometer.

In an embodiment, the pre-measuring device is a camera, a sensor barrier, a pyrosensor, and/or a combination of a transmitter and a receiver of high frequency fields.

In an embodiment, the NMR spectrometer arrangement comprises a probe arrangement according to the preceding explanations.

Such a probe arrangement enables an accordingly equipped NMR spectrometer to perform high throughput analyses since a high number of sample tubes can be fed into the probe of the NMR spectrometer and measured therein one after the other. Thereby, a novel sample tube can be automatically fed into the probe when the previously measured NMR sample tube is discharged from the probe. As explained above, the necessary NMR parameters can already be determined or estimated before the NMR sample tube enters the measuring area of the probe. Therewith, not only the sample tube feeding into the probe but also the accomplishing of preparatory work for the next sample tube in parallel to measuring a previous sample tube speeds up the whole measuring process of such an NMR spectrometer.

The described novel probe arrangement for an NMR spectrometer enables a very favourable time ratio between measuring time and sample preparation time. Whereas this time ratio is 1:5 for prior art NMR devices, it lies in a range of 10:1 to 1:1, in particular 8:1 to 2:1, in particular 7:1 to 3:1, in particular 6:1 to 4:1 and very particular around or exactly by 5:1 for an NMR device equipped with a probe arrangement as explained above.

In an aspect, the instantly claimed invention also relates to a first method for transporting a measuring sample tube into and out of the probe of an NMR spectrometer using a probe arrangement according to the preceding explanations. This first method comprises the steps explained in the following.

First, a measuring sample tube is fed into a pathway for sample tubes of the probe arrangement in a guiding direction. Thereby, a first sample tube and a second sample tube are already present in the pathway, namely, behind high-frequency coil in the guiding direction. If the probe arrangement is vertically aligned, the guiding direction vertically faces from top to bottom. Then, the first sample tube and the second sample tube are below the high-frequency coil. Thereby, the second sample tube is arranged behind the first sample tube in the guiding direction. A movement of the second sample tube is not possible, but rather blocked by a second blocker.

Prior to or after this feeding step, the movement of the first sample tube it is made impossible by a first blocker. This means, the first blocker fixes the first sample tube. Thereby, a bottom of the first measuring sample tube abuts against a top of the first sample tube. The top of the first sample tube aligns and adjusts the first measuring sample tube into the correct measuring position with respect to the high-frequency coil of the probe arrangement.

Afterwards, the second sample tube is released by transferring the second blocker from a blocking position to a non-blocking position. In doing so, the second sample tube is discharged from the probe arrangement. It can fall out of the probe arrangement if the guiding direction extends particularly as indicated above.

Afterwards, the second blocker is transferred from its non-blocking position to its blocking position. Thereby, it does not contact any sample tube at the moment, since the first sample tube cannot move within the pathway since it is still blocked by the first blocker.

Afterwards, the first blocker is transferred from a blocking position to a non-blocking position. This results in releasing the first sample tube so that the first sample tube is allowed to move along the guiding direction towards the second blocker. Since the first sample tube has previously supported the first measuring sample tube, the first measuring sample tube is also allowed to move along the guiding direction towards the first blocker.

Then, the first sample tube is blocked by the second blocker. In this position, the first sample tube could also be denoted as second sample tube since it has now exactly the same position as the second sample tube in a preceding step of the method.

In addition, the first measuring sample tube is blocked by the first blocker. Thus, the first measuring sample tube could be also denoted in this position as first sample tube since it is now in exactly the same position as the first sample tube has been in a previous step of the method.

Afterwards, the second blocker is transferred from its blocking position to its non-blocking position. This leads to releasing the first sample tube so that it is discharged from the probe arrangement. As indicated above, this discharge process can be supported (or carried out only) by gravity if the probe arrangement is vertically aligned.

Afterwards, the second blocker is again transferred from its non-blocking position to its blocking position. This guarantees that upon releasing the first measuring sample tube by the first blocker, the first measuring sample tube cannot fall too far so that it might break. Rather, the second blocker serves for stopping the first measuring sample tube prior to be discharged out of the probe arrangement.

Afterwards, the first blocker is transferred from its blocking position to its non-blocking position. This leads to a release of the first measuring sample tube so that it is allowed to move along the guiding direction towards the second blocker. As indicated above, the second blocker now blocks any further movement of the first measuring sample tube. Thus, the second blocker serves as brake within the whole process.

Finally, the second blocker is transferred from its blocking position to its non-blocking position. This results in releasing the first measuring sample tube so that it can move further on along the guiding direction. Consequently, the first measuring sample tube is discharged from the probe arrangement.

In an aspect, the instantly claimed invention also relates to a second method for transporting a measuring sample tube into and out of the probe of an NMR spectrometer using a probe arrangement according to the preceding explanations. This second method comprises the steps explained in the following.

First, a first measuring sample tube is fed into a pathway for sample tubes of the probe arrangement in a guiding direction.

A movement of the first measuring sample tube is then blocked by a first of third blockers. If the probe arrangement is vertically aligned, the first of the third blockers is the topmost third blocker (i.e., the most distant third blocker from the high-frequency coil).

Afterwards, intermediate third blockers that are arranged behind the first of the third blockers in the guiding direction are sequentially opened and closed. Opening a third blocker means to transfer it into its non-blocking position. Closing a third blocker means to transfer it into its blocking position. By this sequential opening and closing process a sequential movement of the first measuring sample tube in the guiding direction from one of the third blockers to an adjacent third blocker is made possible. Since alternating third blockers belong to different group of third blockers, the first measuring sample tube cannot pass across more than one third blocker at a time. Thus a defined movement of the first measuring sample tube along the third blockers is enabled. The first measuring sample tube is moved along the third blockers towards the last of the third blockers. This last of the third blockers is the nearest third blocker to the high-frequency coil. It can also be denoted as lowest third blocker.

This last of the third blockers is then opened to allow a movement of the first measuring sample tube in the guiding direction towards the high-frequency coil. The first measuring sample tube is stopped in its movement by a first sample tube which is itself blocked by a first blocker. As a result, the first measuring sample tube abuts with its bottom against a top of the first sample tube. The first sample tube is in a defined position because its movements are blocked by the first blocker. Due to the close contact of the bottom of the first measuring sample tube to the top of the first sample tube, the first sample tube aligns the first measuring sample tube in a correct measuring position with respect to the high-frequency coil.

Now, an NMR measurement can be performed on a sample contained within the first measuring sample tube.

Afterwards, the first blocker is transferred from a blocking position to a non-blocking position (i.e., it is opened). This leads to releasing the first sample tube so that the first sample tube is allowed to move along the guiding direction. Since there is no further barrier for the first sample tube in the guiding direction within the bore of the probe arrangement, the first sample tube is discharged from the probe arrangement. As indicated above, this discharge process can be supported (or carried out only) by gravity if the probe arrangement is vertically aligned.

Additionally, the first measuring sample tube moves from its measuring position in the guiding direction towards and partly along the first blocker, since the first measuring sample tube has been previously supported by the first sample tube which is now no longer present to support the first measuring sample tube.

Then, the movement of the first measuring sample tube is blocked by the first blocker. The first measuring sample tube could be also denoted in this position as first sample tube since it is now in exactly the same position as the first sample tube has been in a previous step of the method.

Afterwards, the first blocker is once again opened so that it releases the first measuring sample tube. The first measuring sample tube can then move along the guiding direction and can be discharged from the probe arrangement.

Usually, NMR sample tubes are not only transported through an NMR probe arrangement, but rather subjected to an NMR measurement of the sample contained in the sample tube. Such a measuring step is accomplished when the first measuring sample tube is positioned in a measuring position, i.e., prior to releasing the first sample tube by transferring the first blocker from a blocking position to non-blocking position. As long as the first blocker is in its blocking position, the first sample tube is properly adjusted within the pathway so that it aligns itself the first measuring sample tube in a correct measuring position. This is the correct time point to carry out the NMR measurement.

The explained methods are not intended for measuring only one sample contained in a single NMR sample tube. Rather, they are intended to allow for measuring a series of NMR samples to allow high throughput analysis of a high number of samples. Therefore, in an embodiment, at least one second measuring sample tube, in particular a plurality of additional measuring sample tubes, is fed into the pathway of sample tubes prior to allowing the first measuring sample tube to move along the guiding direction towards the first blocker or prior to allowing the first sample tube to be discharged from the probe arrangement. Thus, in this embodiment provision is made that at least one additional measuring sample tube is already present within the sample tube pathway of the probe arrangement. Then, a pre-equilibration of the sample contained in the sample tube (e.g. with respect to temperature) can be carried out.

In an embodiment, in particular of the first method, a stack of sample tubes rests on the top of the first measuring sample tube prior to allowing the first measuring sample tube to move along the guiding direction towards the first blocker. Thus, in this embodiment, each sample tube supports a subsequent sample tube that is arranged behind the respective sample tube in the guiding direction. Such a self-supporting stack of sample tubes is particularly suited to be moved along the guiding direction within the pathway of the probe arrangement instantly described. However, it should be noted that it is not necessary within the instantly described and claimed method to provide a stack of sample tubes behind the high-frequency coil. Rather, it is only necessary to allow for two sample tubes being arranged behind the high-frequency coil during the sequence of NMR measurements implementing the instantly described method. The first sample tube behind the high-frequency coil aligns the measuring sample tube in which the sample to be actually measured is contained. The second sample tube behind the high-frequency coil is in a waiting position in which it waits to be discharged from the probe arrangement.

In an embodiment, in particular of the second method, at least two further measuring sample tubes are present in the pathway for sample tubes prior to releasing the first sample tube. Thereby, the third blockers serve for a distance between the further sample tubes. Thus, these further sample tubes do not contact each other. Rather, the third blockers are arranged such that there is always air between the top of a first further sample tube and a bottom of a succeeding further sample tube. Therewith, no stack of sample tubes is built up. Rather, individual sample tubes are present in the pathway for sample tubes. This leads to only a low weight being able to act upon an individual sample tube that is transferred from the last (lowest) third blocker to the measuring position, in which it contacts with its bottom a sample tube arranged beneath it that is blocked in its movements by the first blocker.

If each of the third blockers is understood to represent a step to be taken by a measuring sample tube on its way through the pathway in the bore towards the high-frequency coil, then every second step is left empty at a specific time point during operation of the probe arrangement. At a subsequent time point, the measuring sample tubes are moved forward so that the steps that have been previously empty are now occupied by sample tubes, wherein the respective other second steps (that have been previously occupied by the sample tubes) are now empty.

In an embodiment, in particular of the second method, a distance is also formed between the top of the first measuring sample tube and the bottom of the further measuring sample tube, when the first measuring sample tube is in its measuring position and the further measuring sample tube is blocked by the lowest of the third blockers. This means that in this embodiment the current measuring sample tube is, in its measuring position, only in contact with a first sample tube arranged beneath it (behind in the guiding direction).

Then, an alignment of this actual measuring sample tube cannot be distorted by any other sample tube yet to be subjected to an NMR measurement.

After the NMR measurement of a sample contained in the actual measuring sample tube, the further measuring sample tube may be released so as to contact with its bottom the top of the actual measuring sample tube. Afterwards, the first blocker may be released so as to discharge the first sample tube as well as to allow a movement of the actual measuring sample tube and the further measuring sample tube in the guiding direction.

It should be noted that it is not necessary within the instantly described and claimed second method to provide a stack of sample tubes behind the high-frequency coil. Rather, it is only necessary to allow for a single sample tube being arranged behind the high-frequency coil during the sequence of NMR measurements implementing the instantly described method. This sample tube behind the high-frequency coil aligns the measuring sample tube in which the sample to be actually measured is contained.

In a further variant of either method, sample parameters are measured, while the sample tube is positioned before the high frequency coil. These sample parameters form the basis for determining or estimating NMR parameters. These NMR parameters are then preset in an NMR spectrometer when the sample tube is positioned in the measuring area of the probe. As already outlined above, such parallel performing of work significantly reduces the overall measuring time. In some cases, fine tuning of NMR parameters might be still necessary after the estimated NMR parameters have been set. However this fine tuning takes much less time as general adjustments of the respective NMR parameters since the variation width in which this fine tuning has to be carried out is much smaller than in case of not presetting any NMR parameters for a specific sample tube. The determined or estimated NMR parameters can be transferred by a control device from the used probe arrangement to the NMR spectrometer (or a control device of the NMR spectrometer). In addition, it is possible that the control device of the probe arrangement is the same device like the control device for the NMR spectrometer. In such a case, the described set operations or preset operations can be carried out particularly easy.

In a further embodiment, tune parameters (being a specific example of NMR parameters) are set by adjusting a magnetic field and an offset frequency of the NMR spectrometer without mechanically operating a capacitor. Such a pure magnetic adjustment to achieve a proper tuning of the NMR spectrometer is much more favourable than a mechanic adjustment as carried out according to prior art NMR spectrometers.

In such prior art NMR spectrometers, the tuning is carried out by mechanically adjusting a trim capacitor. This adjustment is regularly done by turning a trim capacitor manually or motor-driven. Both the used motors and particularly the trim capacitor have only a limited number of turning or movement cycles. Therewith, the lifetime of these components is finite. In addition, the mechanic adjustment to achieve a proper tuning is slow and only poorly reproducible.

In contrast, the magnetic adjustment according to the explained variant of the claimed method is very fast and highly reproducible. There is no abrasion of any mechanical parts. Consequently, the lifetime of the NMR spectrometer is increased, while the overall measurement time for a single sample tube is decreased.

This magnetic adjustment of the tune parameters cannot only be carried out as part of the claimed method. It can rather be seen as a separate tuning method applicable to all NMR spectrometers and having a plurality of favourable technical effects with respect to prior art tuning methods. Therewith, a method for tuning the magnetic field of an NMR spectrometer by adjusting a magnetic field and an offset frequency of the NMR spectrometer without mechanically operating a capacitor, in particular without mechanically operating a trim capacitor, is herewith also separately disclosed.

Specific embodiments described with respect to the method for performing an NMR measurement can be equivalently applied to the described probe arrangement for an NMR spectrometer, to the described NMR spectrometer arrangement, to the methods for transporting a sample tube into and out of a probe of an NMR spectrometer, and vice versa. Thereby, any desired combinations of any of the explained specific embodiments are to be considered as forming part of the instant disclosure.

BRIEF DESCRIPTION OF THE DRAWINGS

The invention will be discussed in the following in more detail with respect to Figures and exemplary embodiments. In the Figures.

DESCRIPTION OF THE INVENTION

Figure 1:
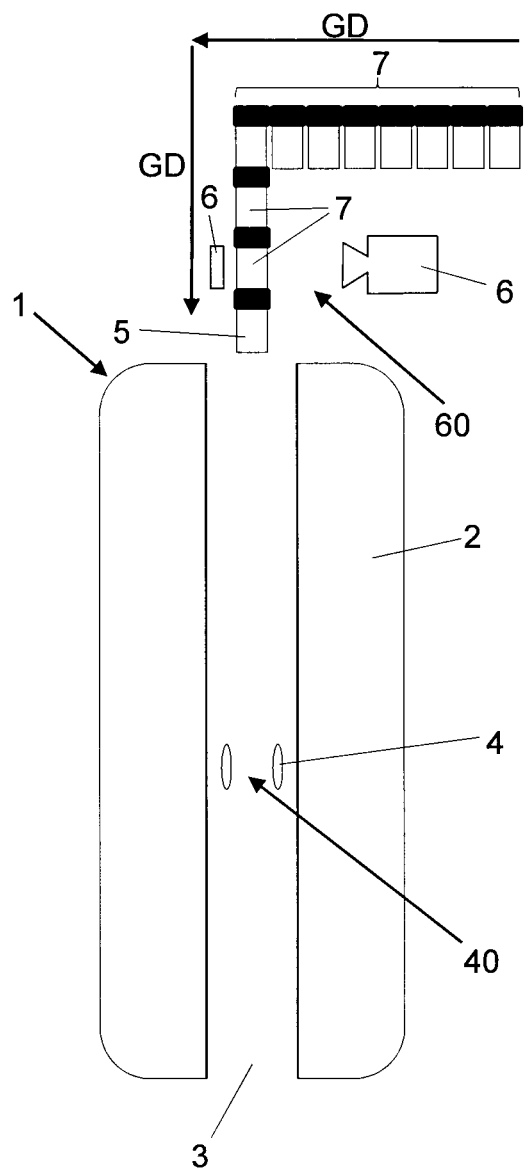
FIG. 1 shows an operative mode of a first exemplary embodiment of a probe arrangement for an NMR spectrometer.

FIG. 1 is a schematic depiction of a probe arrangement 1 comprising a probe 2 for an NMR spectrometer. Along the vertical axis of the probe 2, a centrally aligned bore 3 is provided in the probe 2. This bore 3 defines a pathway for NMR sample tubes.

Approximately in the center of the bore 3, a high-frequency coil 4 is arranged which is able to generate high-frequency magnetic pulses that are needed for an NMR measurement.

The high-frequency coil 4 defines a measuring zone 40 which is located in a space surrounded by the high-frequency coil 4. The measuring zone 40 serves as measuring area. For subjecting the first measuring sample tube 5 to an NMR measurements, this first measuring sample tube 5 is fed in a guiding direction GD towards the measuring zone 40.

Prior to subjecting a sample contained in the first measuring sample tube 5 to an NMR measurement in the measuring zone 40, specific sample properties of the sample contained in the first measuring sample tube 5 have been determined by a transmitter and receiver of high frequency pulses 6 which serves as pre-measuring device. The transmitter and receiver 6 defines a pre-measuring zone 60 which serves as pre-measuring area and is located in front of the measuring zone 40 in the guiding direction GD.

By the transmitter and receiver 6, the permeability and the susceptibility of the sample of the sample contained in the first measuring sample tube 5 have already been determined. In addition, in the operational mode depicted in FIG. 1, the permeability and the susceptibility of a sample contained in the first further sample tube 7 are currently being determined.

The determination of the permeability and the susceptibility of the sample contained the first measuring sample tube 5 serves for adjusting shim and match parameters of the probe arrangement 1. Thus, when the first measuring sample tube 5 enters the bore 3 of the probe arrangement 1 and is located in the measuring zone 40, the relevant match and shim parameters are already set to the values being suited for a precise NMR measurement of the sample contained in the first measuring sample tube 5.

It is possible to use different pre-measuring devices 6 that can be sequentially arranged in the guiding direction GD in front of the high-frequency coil 4, thus defining different pre-measuring zones 60. It is also possible to arrange different pre-measuring devices 6 at approximately the same position with respect to the high-frequency coil 4 in front of the high-frequency coil 4, so that different pre-measuring devices 6 use the same pre-measuring zone 60, in particular at different time points.

Figure 2:
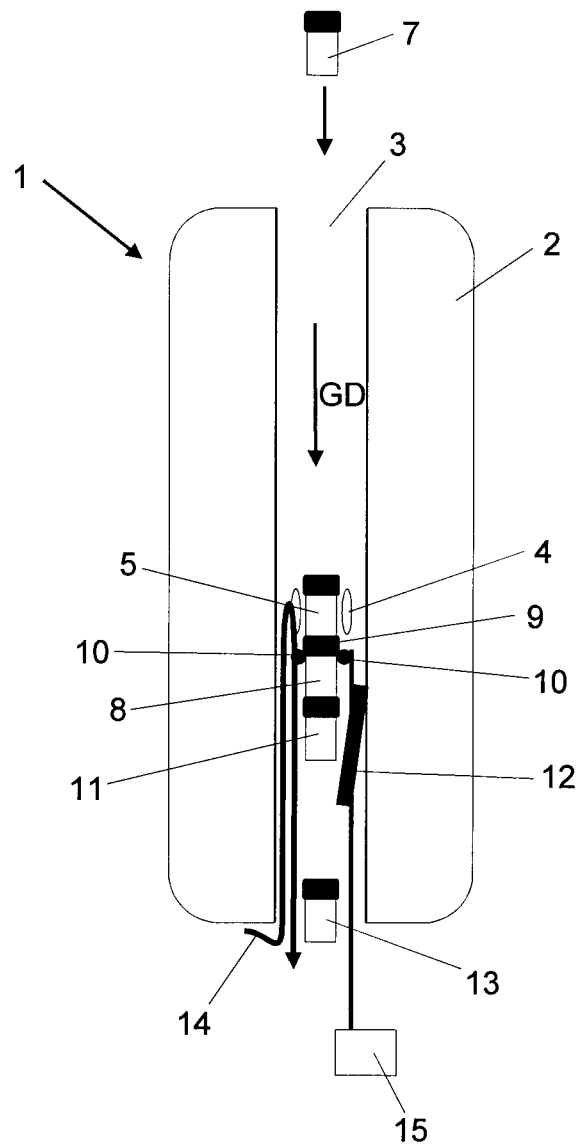
FIG. 2 shows an operative mode of a second exemplary embodiment of a probe arrangement for an NMR spectrometer.

FIG. 2 shows a second embodiment of a probe arrangement 1, wherein the same numeral references as in FIG. 1 are used for the same elements.

In the operative mode of the probe arrangement 1 shown in FIG. 2, a first measuring sample tube 5 is positioned with respect to the high-frequency coil 4 such that the sample contained in the first measuring tube 5 can be subjected to an NMR measurement.

The first measuring sample tube 5 is supported and aligned by a first sample tube 8 which is arranged directly below the first measuring sample tube 5. A sample tube cap 9 of the first sample tube 8 abuts against the bottom of the first measuring sample tube 5.

The first sample tube 8 is held in a defined position by a pair of cams 10 which serve as first blocker. The cams 10 grip lateral sides of the first sample tube 8 such that the first sample tube 8 is fixed in a defined position. This is done in the exemplary embodiment shown in FIG. 2 such that the sample tube cap 9 slightly projects over the lateral sides of the first sample tube 8 so that the cams 10 support the sample tube cap 9 so that it cannot glide along the cams 10 if they are in their blocking position as shown in FIG. 2.

It is possible for the cams 10 to be moved into a non-blocking position in which the distance between the cams 10 and the lateral sides of the first sample tube 8 or the sample tube cap 9, respectively, is sufficiently big so that the first sample tube 8 can pass the cams 10.

Below the first sample tube 8, a second sample tube 11 is arranged which can be supported by a brake 12 that serves as second blocker. It can also be denoted as break 12. In a blocking position, the brake 12 abuts against a lower portion (such as the bottom) of the second sample tube 11. In FIG. 2, the brake 12 is shown in a position in which it is moved from its blocking position to its non-blocking position. In its non-blocking position, the brake 12 no longer supports the second sample tube 11, so that the second sample tube 11 can fall out of the bore 3 due to gravity. This is shown for a previous sample tube 13 that has been supported by the brake 12 prior to the second sample tube 11.

In order to allow for a good temperature equilibration of the sample contained in the first measuring sample tube 5, a first air flow 14 is introduced into the bore 3 of the probe 2 from a lower side of the probe 2. This first air flow 14 has a defined temperature and serves for defined measuring conditions of the sample to be measured. The first air flow 14 is not only introduced from the lower side of the probe 2, it also exits the probe 2 again to its lower side. Thus, it is guided along a flow path which allows a change of direction of the first air flow 14. This flow path is provided by a guiding rod which is not shown in the schematic depiction of FIG. 2.

From FIG. 2, it becomes clear that a minimum of three sample tubes (namely the first measuring sample tube 5, the first sample tube 8, and the second sample tube 11) are needed for proper operation of the probe arrangement 1. If the measurement of the sample contained in the first measuring sample tube 5 is completed, the brake 12 opens so that the second measuring sample tube 11 can fall out of the bore 3 of the probe 2. Already prior to this, a previously measured sample tube 13 has been fallen out of the bore 3. The first sample tube 8 is still held in place by means of the cams 10, and also the first measuring sample tube 5 cannot move along the guiding direction GD since it is supported by the first sample tube 8.

Afterwards, the brake 12 is moved from its open (non-blocking) position to its closed (blocking) position. Then, the cams 10 move away from the sides of the first sample tube 8, i.e. they are moved from the blocking position to the non-blocking position. This results in the first sample tube 8 to move forwards in the guiding direction GD until its bottom contacts the brake 12.

At the same time, the first measuring sample tube 5 moves forward in the guiding direction GD, wherein its movement is stopped by the cams 10 so that the first measuring sample tube 5 takes in the position which was occupied before by the first sample tube 8. Now, an NMR measurement on the sample contained in the first measuring sample tube 5 can be performed.

Afterwards, the brake 12 opens again and the first sample tube 8 can fall out of the bore 3 of the probe 2. Then, the brake 12 closes again and the cams 10 release the first measuring sample tube 5. This moves then forwards in the guiding direction GD towards the brake 12 and is supported by the brake 12. Afterwards, the brake 12 opens again and the first measuring sample tube 5 can fall out of the bore 3 of the probe 2.

If a sample contained in a further measuring sample tube 7 is to be measured, this further measuring sample tube 7 is to be inserted into the bore 3 of the probe 2 in the guiding direction GD.

To allow for precise and synchronized movement of the cams 10 and brake 12, a motor 15 is arranged adjacent to the probe 2. This motor 15 is controlled by a control device that can be the same control device controlling the overall NMR measuring process.

The probe arrangement 1 shown in FIG. 2 is intended to be used for a high number of sample tubes containing samples to be measured subsequently in a high-throughput measuring process. This is illustrated in FIG. 3.

Figure 3:
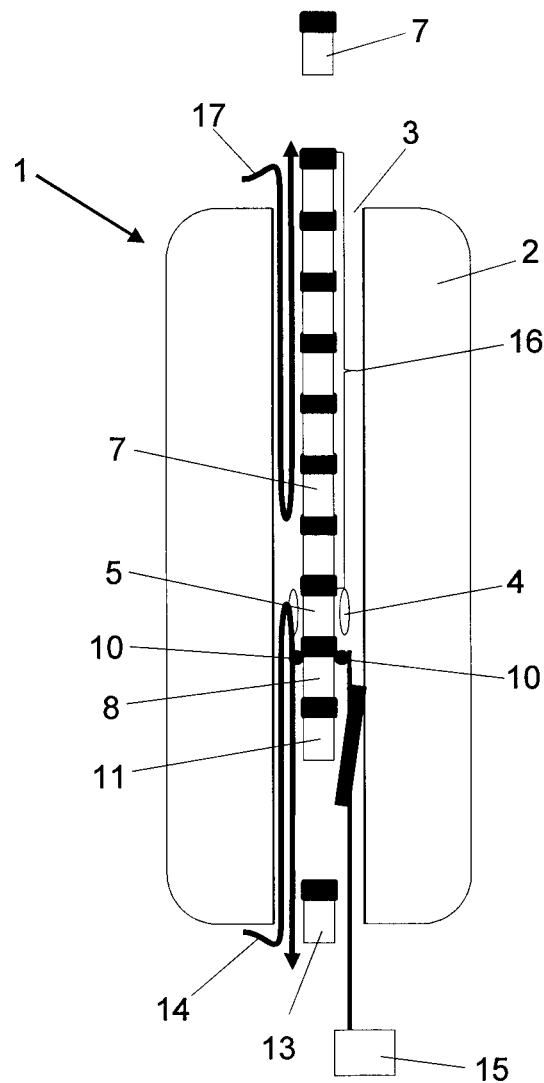
FIG. 3 shows an operative modes of a third exemplary embodiment of a probe arrangement for an NMR spectrometer.

FIG. 3 shows a third embodiment of a probe arrangement 1, wherein once again the same numeral references as in FIGS. 1 and 2 are used for the same elements.

In the operative mode of the embodiment shown in FIG. 3, not only a single first measuring tube 5, but rather a queue or stack 16 of further measuring sample tubes 7 is provided in front of the high-frequency coil 4 in the guiding direction GD. Whereas the overall functioning of the embodiment of FIG. 3 is equal to the functioning of the embodiment shown in FIG. 2, it is made clear that in the operative mode shown in FIG. 3, a new further measuring sample tube 7 is introduced into the bore 3 in the guiding direction GD whenever an already measured sample tube 13 is discharged from bore 3.

Thereby, the stack 16 of measuring sample tubes containing samples to be measured is arranged such that each lower sample tube supports the adjacent higher sample tube. Thereby, the bottom of each higher sample tube abuts against a sample tube cap of the respective adjacent lower sample tube. The stack 16 of measuring sample tubes is—as well as the first measuring sample tube 5—at the end supported by first sample tube 6 which is held by the cams 10. Thus, the cams 10 have to be constructed such that they are enabled to support the full stack 16 of measuring sample tubes.

As already mentioned above, an NMR measurement is usually performed at a specific temperature. In order to achieve a pre-equilibration in temperature of the samples contained in the further sample tubes 7 of the stack 16 of measuring sample tubes, a second air flow 17 is introduced from the top of the bore 3 into the bore 3. Thereby, this second air flow 17 exits the bore 3 also to the top of the bore 3. Thus—like in the case of the first air flow 14—an air flow passage is defined within the bore 3 which allows a shift of direction of the second air flow 17. This air flow passage can once again be provided by a guiding rod which in turn serves for guiding the stack 16 of further measuring sample tubes 7 towards the high-frequency coil 4.

Such temperature pre-equilibration serves for a reduced time necessary to finally equilibrate the sample contained in the first measuring sample tube 5 in the measuring position. Thus, time is saved so that the overall number of measurements per time interval is increased.

It should be noted that the cams 10 and the brake 12 are synchronized such that it is not possible that both the cams 10 and the brake 12 are in their non-blocking position. Either the cams 10 block the first sample tube 8 or the brake 12 blocks the second sample tube 11 or both the cams 10 and the brake 12 block the respective sample tube 6, 9. Due to this arrangement, it is guaranteed that the sample tubes do not fall a distance that is too big when being discharged from the probe 2.

This is in particular important if the probe arrangement is used for high throughput analyses. In such a case, the stack 16 of further measuring sample tubes 7 rests on the first sample tube 8 held by the cams 10. If this first sample tube 8 was allowed to be discharged directly from the probe 2, not only gravity forces due to its own weight would serve for discharging it in the guiding direction GD, but also gravity forces due to the weight of the stack 16 of further measuring sample tubes 7 resting upon the first sample tube 8. By only allowing a movement of the first sample tube 8 towards the brake 12, decoupling between the stack 16 of further measuring sample tubes 7 and the first sample tube 8 now resting on the brake 12 is achieved. If the brake 12 now opens and releases the sample tube resting on it, this sample tube will not additionally be pressed by the full stack 16 of further measuring sample tubes 7, but will rather fall out of the probe 2 simply due to its own weight. This guarantees that each sample tube can be discharged from the probe 2 in such a way that it will not break after being discharged. Additionally, a cushioned sample tube receiver can be provided which allows for a soft landing of the sample tubes being discharged from the probe 2.

FIGS. 4A to 4G show a fourth embodiment of a probe arrangement 1, wherein the same numeral references as in FIG. 1 are used for the same elements.

The first sample tube 8 is held in a defined position by a pair of first cams 10 which serve as first blocker. The first cams 10 grip lateral sides of the first sample tube 8 such that the first sample tube 8 is fixed in a defined position. This is done in the exemplary embodiment shown in FIG. 4A such that the sample tube cap 9 slightly projects over the lateral sides of the first sample tube 8 so that the first cams 10 support the sample tube cap 9 so that it cannot glide along the first cams 10 if they are in the blocking position.

It is possible for the first cams 10 to be moved into a non-blocking position in which the distance between the first cams 10 and the lateral sides of the first sample tube 8 or the sample tube cap 9, respectively, is sufficiently big so that the first sample tube 8 can pass the first cams 10.

A first measuring sample tube 5 is also present within the bore 3 at an entrance of the bore 3 at a top position of the same. This first measuring sample tube 5 is held in place by two topmost further cams 18 which serve as a third blocker, or, to be more specifically, as the topmost third blocker of all third blockers. Below the two topmost further cams 18, three pairs of intermediate further cams 19, 20, 21 are arranged that serve as intermediate third blockers. Subsequently in a guiding direction GD, two lowest further cams 22 are arranged. The topmost further cams 18, the intermediate further cams 20 and the lowest further cams 22 belong to a first group of further cams. Similarly, the intermediate further cams 19 and 21 belong to a second group of further cams.

If now the first group of further cams is transferred from its closed (blocking) position to its open (non-blocking) position, the second group of further cams is transferred from its non-blocking position to its blocking position. Thus, the first measuring sample tube 5 can move in the guiding direction GD from the topmost further cams 18 to the first pair of intermediate further cams 19. This is shown in FIG. 4B. However, no further movement of the first measuring sample tube 5 is possible since the first pair of intermediate further cams 19 is in its blocking position and thus blocks the first measuring sample tube 5.

Afterwards, the second group of further cams is transferred from its blocking position into its non-blocking position, whereas the first group of cams is transferred back from its non-blocking position into its blocking position. This leads in a movement of the first measuring sample tube 5 from the first pair of intermediate further cams 19 to a second pair of intermediate further cams 20. This is shown in FIG. 4C.

Now, this process of sequential opening and closing further cams 18, 19, 20, 21, 22, which all can be denoted as upper cams since they are arranged above the high-frequency coil 4, is repeated so that a sequential movement of the first measuring sample tube 5 in the guiding direction GD is made possible.

Figure 4D:
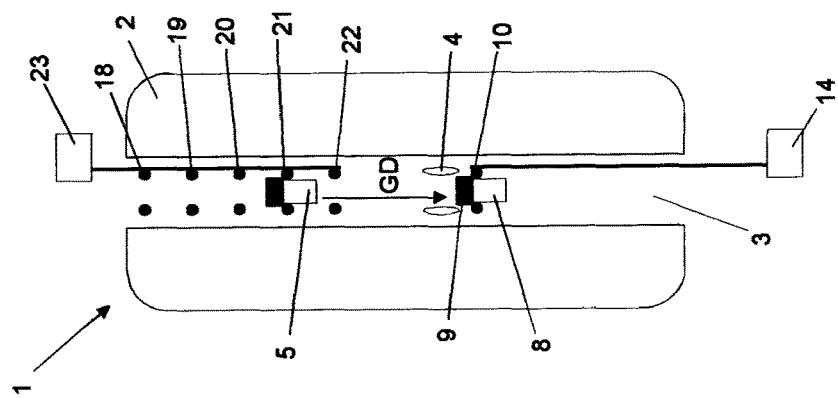
FIG. 4D shows a fourth step of the sample tube transportation process in the fourth exemplary embodiment of the probe arrangement for an NMR spectrometer shown in FIG. 4A.
Figure 4C:
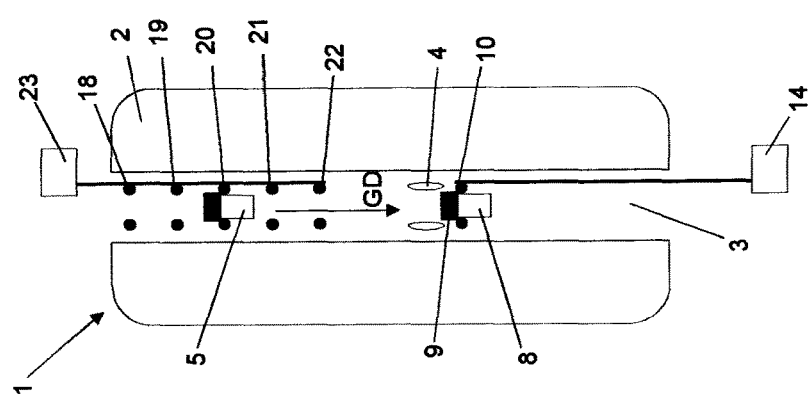
FIG. 4C shows a third step of the sample tube transportation process in the fourth exemplary embodiment of the probe arrangement for an NMR spectrometer shown in FIG. 4A.
Figure 4B:
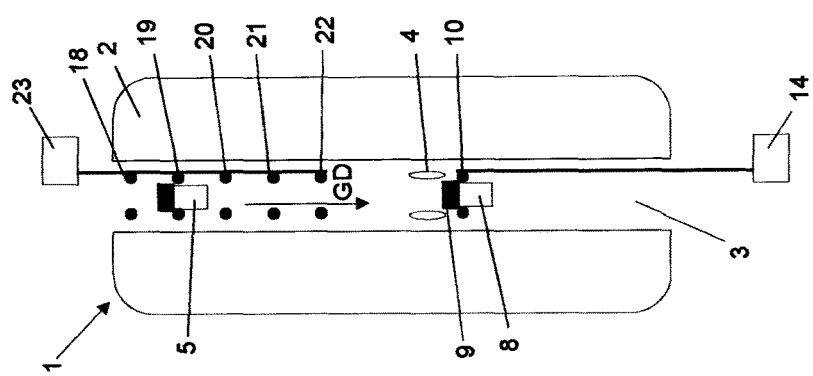
FIG. 4B shows a second step of the sample tube transportation process in the fourth exemplary embodiment of the probe arrangement for an NMR spectrometer shown in FIG. 4A.
Figure 4A:
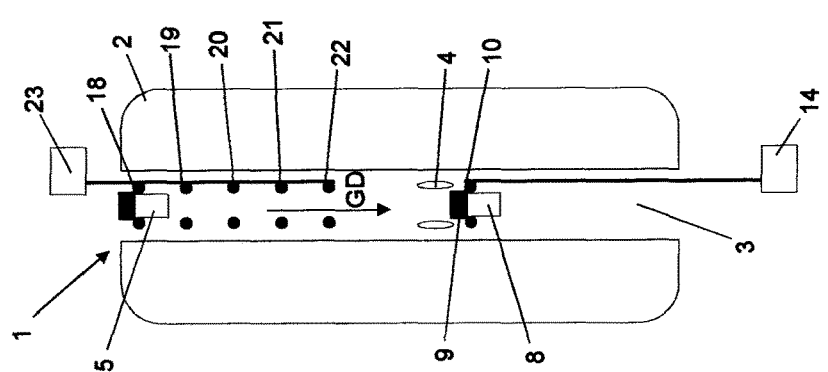
FIG. 4A shows a first step of a sample tube transportation process in a fourth exemplary embodiment of a probe arrangement for an NMR spectrometer.

In FIG. 4D, the first measuring sample tube 5 is moved along the guiding direction GD further on so as to be now held by a last pair of intermediate further cams 21.

Figure 4G:
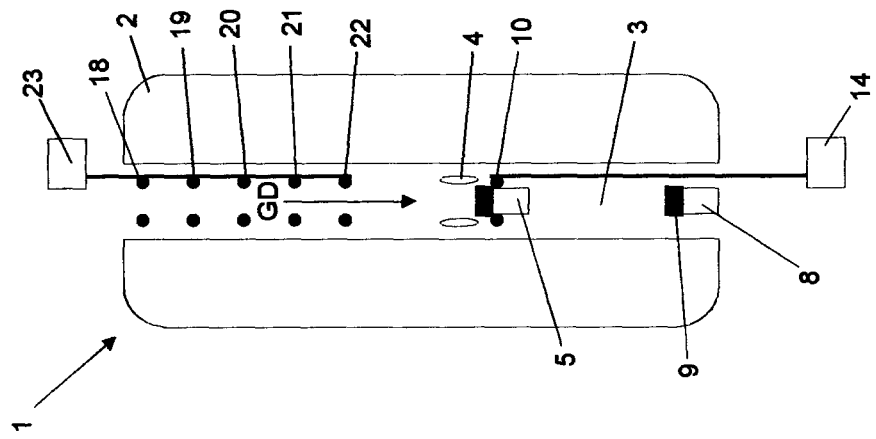
FIG. 4G shows a seventh step of the sample tube transportation process in the fourth exemplary embodiment of the probe arrangement for an NMR spectrometer shown in FIG. 4A.
Figure 4F:
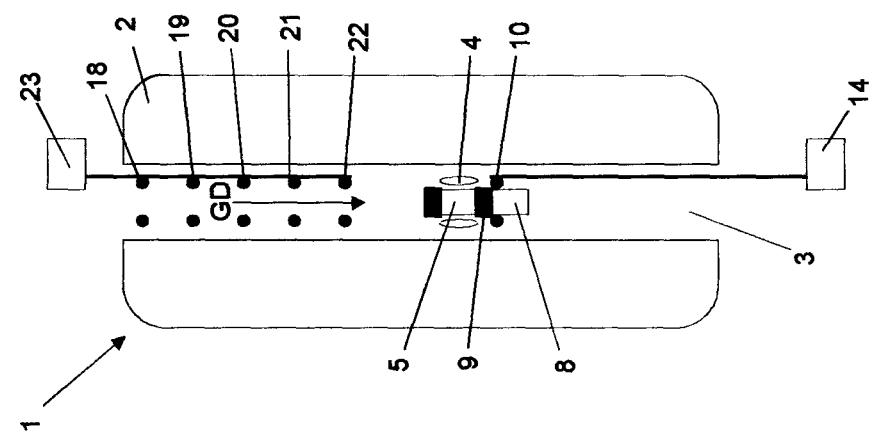
FIG. 4F shows a sixth step of the sample tube transportation process in the fourth exemplary embodiment of the probe arrangement for an NMR spectrometer shown in FIG. 4A.
Figure 4E:
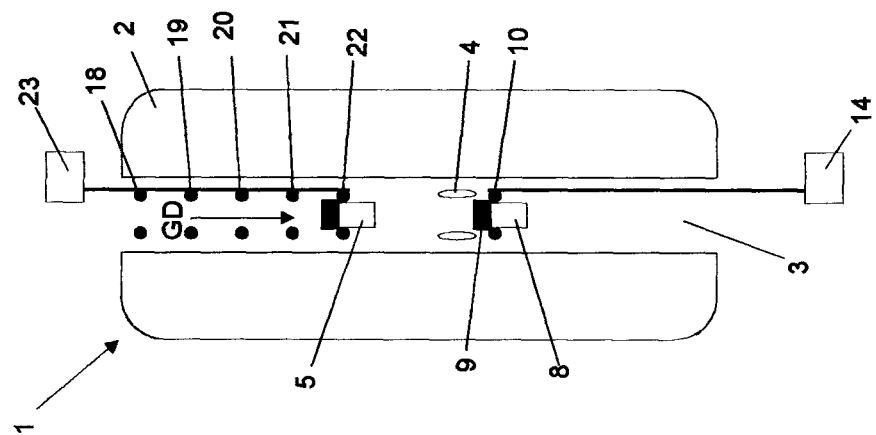
FIG. 4E shows a fifth step of the sample tube transportation process in the fourth exemplary embodiment of the probe arrangement for an NMR spectrometer shown in FIG. 4A.

As shown in FIG. 4E, the first measuring sample tube 5 is then moved further on towards a last (or lowest) pair of further cams 22 and is held by these last further cams 22 in place.

As shown in FIG. 4F, after releasing the first measuring sample tube 5 from the lowest pair of further cams 22 by transferring the lowest pair of further cams 22 from its blocking position into its non-blocking position, the first measuring sample tube 5 falls onto the cap 9 of the first sample tube 8 which is still held in place by the first cams 10. The first measuring sample tube 5 is now in its correct measuring position in which the high-frequency coil 4 can introduce high-frequency magnetic pulses into a sample contained within the first measuring sample tube 5. An NMR measurement can take place.

Afterwards, the first sample tube 8 is released from the first cams 10 by transferring the first cams 10 from their blocking position into their non-blocking position. This leads to a discharge of the first sample tube 8 from the probe arrangement 1. The first cams 10 are then transferred back from their non-blocking position into their blocking position so as to block a further movement of the first measuring sample tube 5. This is shown in FIG. 4G.

Afterwards, the first measuring sample tube 5 which is now held in place by the first cams 10 is also released from the first cams 10 and discharged from the probe arrangement 1 due to gravity by transferring the first cams 10 from their blocking position into their non-blocking position.

In all of FIGS. 4A to 4G, a first motor 14 for driving the first cams 10 as well as a second motor 23 for driving the further cams 18, 19, 20, 21, 22 can be seen. It is also possible to use only a single motor to drive all cams.

To allow for precise and synchronized movement of the first cams 10 and the further cams 18, 19, 20, 21, 22, the motors 14, 23 are controlled by a control device that can be the same control device controlling the overall NMR measuring process.

The probe arrangement 1 shown in FIGS. 4A to 4G is intended to be used for a high number of sample tubes containing samples to be measured subsequently in a high-throughput measuring process. This is illustrated in FIG. 5.

Figure 5:
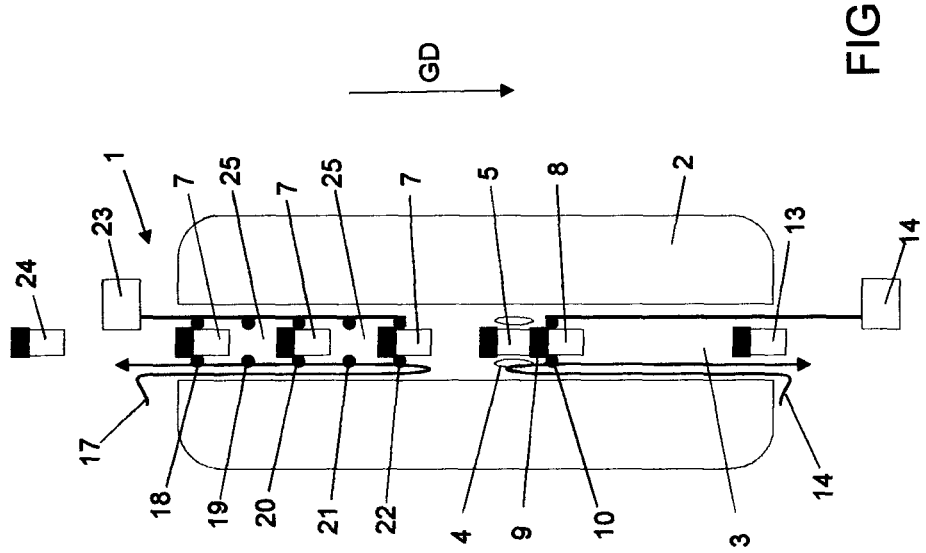
FIG. 5 shows an overview depiction of an operative mode of the fourth exemplary embodiment of the probe arrangement for an NMR spectrometer shown in FIG. 4A.

Thus, FIG. 5 shows another operative mode of the embodiment already known from FIGS. 4A to 4G. This operative mode reflects a high throughput process in which a high number of individual sample tubes is fed into the probe arrangement 1 and is measured by magnetic pulses emitted from the high-frequency coil 4 within the probe arrangement 1. The same numeral references as in FIGS. 4A to 4G are used for the same elements.

Instead of only a single first measuring sample tube 5, a plurality of further measuring sample tubes 7 is already present within the bore 3 of the probe arrangement 1. Another further measuring tube 24 waits to be fed to the probe 3 of the probe arrangement 1. In addition, besides the single first sample tube 8, another sample tube 13 has already been subjected to an NMR measurement prior to measuring the first measuring sample tube 5 and is currently being discharged from the bore 3 of the probe arrangement 1.

In order to allow for a good temperature equilibration of the sample contained in the first measuring sample tube 5, a first air flow 14 is introduced into the bore 3 of the probe 2 from a lower side of the probe 2. This first air flow 14 has a defined temperature and serves for defined measuring conditions of the sample to be measured. The first air flow 14 is not only introduced from the lower side of the probe 2, it also exits the probe 2 again to its lower side. Thus, it is guided along a flow path which allows a change of direction of the first air flow 14. This flow path is provided by a guiding rod which is not shown in the schematic depiction of FIG. 5.

Whereas the overall functioning of the embodiment of FIG. 5 is equal to the functioning of the embodiment shown in FIGS. 4A to 4G, it is made clear that in the operative mode shown in FIG. 5, a new measuring sample tube is introduced into the bore 3 in the guiding direction GD whenever an already measured sample tube is discharged from bore 3.

Thereby, the further measuring sample tubes 7 do not contact each other. Thus, they do not form a stack of sample tubes. Rather, air 25 is present between the individual further sample tubes 7. This is connected to the technical effect that the lowest of the further measuring sample tubes 7 is not pressed by any other further measuring sample tube 7 when it moves further on in the guiding direction GD towards the measuring position in which it is supported by the first sample tube 8 (another sample tube then taking in the position of the first sample tube 8).

As already mentioned above, an NMR measurement is usually performed at a specific temperature. In order to achieve a pre-equilibration in temperature of the samples contained in the further measuring sample tubes 7, a second air flow 17 is introduced from the top of the bore 3 into the bore 3. Thereby, this second air flow 17 exits the bore 3 also to the top of the bore 3. Thus—like in the case of the first air flow 14—an air flow passage is defined within the bore 3 which allows a shift of direction of the second air flow 17. This air flow passage can once again be provided by a guiding rod which can be used to support the further cams 18, 19, 20, 21, 22.

As can be seen from FIG. 5, there is always a distance between the lowest of the further measuring sample tubes 7 and the first measuring sample tube 5 as long as the lowest pair of further cams 22 is in its blocking position. If the lowest of the further sample tubes 7 is released by the lowest further cams 22, it can fall onto the first measuring sample tube 5. This step is usually performed when the first cams 10 have already released the first sample tube 8 by having been transferred into their non-blocking position. Then, only the first measuring sample tube 5 pushes against the first sample tube 6 when the latter is discharged from the bore 3.

Afterwards, the lowest of the further measuring sample tubes 7 contacts the top of the first measuring sample tube 5 so that no impulse is transferred from the lowest of the further measuring sample tubes 7 to the first sample tube 8 which is being discharged. Due to this arrangement, the first sample tube 8 as well as any further sample tube can be discharged without having to fear that it breaks upon discharging. Additionally, a cushioned sample tube receiver can be provided which allows for a soft landing of the sample tubes being discharged from the probe 2.

The invention claimed is:

1. A method for performing an NMR measurement on a sample contained in a sample tube by using an NMR spectrometer, comprising:
    feeding a first measuring sample tube in a guiding direction to a pre-measuring area being located, in the guiding direction, outside of a bore of the NMR spectrometer before a measuring area of the NMR spectrometer, the pre-measuring area being arranged and designed for measuring a sample parameter of a sample contained in the first measuring sample tube to determine or to estimate an NMR parameter,
    feeding the first measuring sample tube in the guiding direction towards the measuring area,
    setting the NMR parameter previously determined or estimated, and
    carrying out an NMR measurement of the sample contained in the first measuring sample tube on the basis of the set NMR parameter.

2. The method according to claim 1, wherein the NMR measurement is carried out immediately after the first measuring sample tube has reached its intended measuring position in the measuring area.

3. The method according to claim 1, wherein the sample parameter measured in the pre-measuring area is at least one chosen from the group consisting of permeability of the sample, susceptibility of the sample, temperature of the sample, optical density of the sample, turbidity of the sample, inhomogeneity of the sample, filling level of the first measuring sample tube and high frequency shielding properties of the sample.

4. The method according to claim 1, wherein the estimated or determined NMR parameter is at least one of the group consisting of a tune parameter, a match parameter and a shimming parameter.

5. The method according to claim 1, wherein the first measuring sample tube has a first end and a second end and is fixed on the first end and the second end in the measuring area during an NMR measurement of the sample contained in the first sample tube.

6. A NMR spectrometer arrangement comprising an NMR spectrometer, wherein the NMR spectrometer arrangement further comprises:
    a pre-measuring device defining a pre-measuring area, the pre-measuring device being arranged and designed for measuring a sample parameter of a sample contained in a sample tube to determine or estimate an NMR parameter, wherein the pre-measuring area is located, in a guiding direction in which sample tubes are guided through the NMR spectrometer arrangement, outside of a bore of the NMR spectrometer before a measuring area of the NMR spectrometer; and
    a control device for setting the NMR parameter and carrying out the NMR measurement of the sample contained in the sample tube on the basis of the set NMR parameter.

7. The NMR spectrometer arrangement according to claim 6, wherein the pre-measuring device is at least one of the group consisting of a camera, a sensor barrier, a pyrosensor, as well as a transmitter and receiver of high frequency fields.

* * * * *